United States Patent
Kant et al.

(10) Patent No.: US 6,940,771 B2
(45) Date of Patent: Sep. 6, 2005

(54) METHODS AND CIRCUITS FOR BALANCING BITLINE PRECHARGE

(75) Inventors: Shree Kant, Union City, CA (US); Aparna Ramachandran, Santa Clara, CA (US); Ranjan Vaish, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/355,802

(22) Filed: Jan. 30, 2003

(65) Prior Publication Data

US 2004/0151044 A1 Aug. 5, 2004

(51) Int. Cl.[7] .................................................. G11C 7/00
(52) U.S. Cl. .................... 365/203; 365/205; 365/230.04
(58) Field of Search .............................. 365/203, 202, 365/205, 210, 230.04, 230.06

(56) References Cited

U.S. PATENT DOCUMENTS

| | | | | |
|---|---|---|---|---|
| 5,517,451 A | * | 5/1996 | Okuzawa | 365/203 |
| 5,719,814 A | * | 2/1998 | Ishikawa | 365/205 |
| 5,850,366 A | * | 12/1998 | Coleman, Jr. | 365/210 |
| 5,999,480 A | * | 12/1999 | Ong et al. | 365/230.06 |

* cited by examiner

*Primary Examiner*—Gene N. Auduong
(74) *Attorney, Agent, or Firm*—Martine Penilla & Gencarella (57) ABSTRACT

A memory array design is provided. Memory cells are defined an intersections of rows and columns. A pair of bitline segments are defined for each column. A connecting load device of each memory cell is connected to either a first or a second of the pair of bitline segments. An equal number of load devices in each column couple to each of the pair of bitlines.

19 Claims, 9 Drawing Sheets

METHODS AND CIRCUITS FOR BALANCING BITLINE PRECHARGE

BACKGROUND OF THE INVENTION

1. Field of the Invention

The present invention relates generally to electrical circuits, and more particularly, to methods and systems for balancing precharging delays when precharging bitlines of a banked memory array of memory cells.

2. Description of the Related Art

Figure 1A:
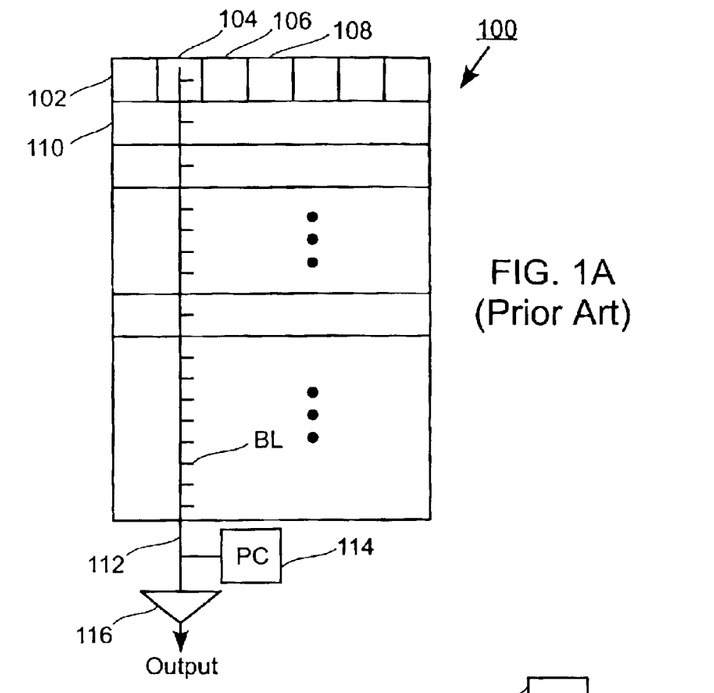
FIGS. 1A–1D are memory devices defining banking techniques used in accordance with the prior art.

In memory circuits, current designs of precharge circuits can exhibit performance limitations due to the arrangement of memory cells on bitlines. FIG. 1A shows a precharge circuit 100 with an array of memory cells organized in rows and columns. The first row 102 contains memory cells, such as, for example, cell 104, cell 106, and cell 108. The array contains a series of rows, such as second row 110 and so on. Memory cell 104 is connected to a bitline 112, indicated by a dash mark where memory cell 104 and bitline 112 intersect. As is well known, bitlines, such as bitline 112 allows the reading of the data stored in memory cell 104. Write bitlines, which are not shown, would allow the writing of data to the memory cell 104. The memory cells located in the column formed below memory cell 104 are also connected to bitline 112. Bitline 112 is connected to sense amp 116 and precharge device 114 is attached to bitline 112. The precharge device 114 precharges the associated bitline 112.

As the number of memory cells attached to a bitline increases, problems can occur due to leakage from the memory cells (i.e., the load impact of each memory cell being coupled to the same long bitline). For example, if the leakage is too great from the memory cells attached to bitline 112, the precharge device 114 must be increased in drive strength so as to efficiently precharge the bitline 112. It is important to note that as the number of memory cells coupled to the bitline 112 increases, this load increase will necessarily increase the time it takes the bitline 112 to reach the designed precharge voltage level. This increase in time therefore reduces the speed of the memory access operation, thus reducing memory performance.

Figure 1B:
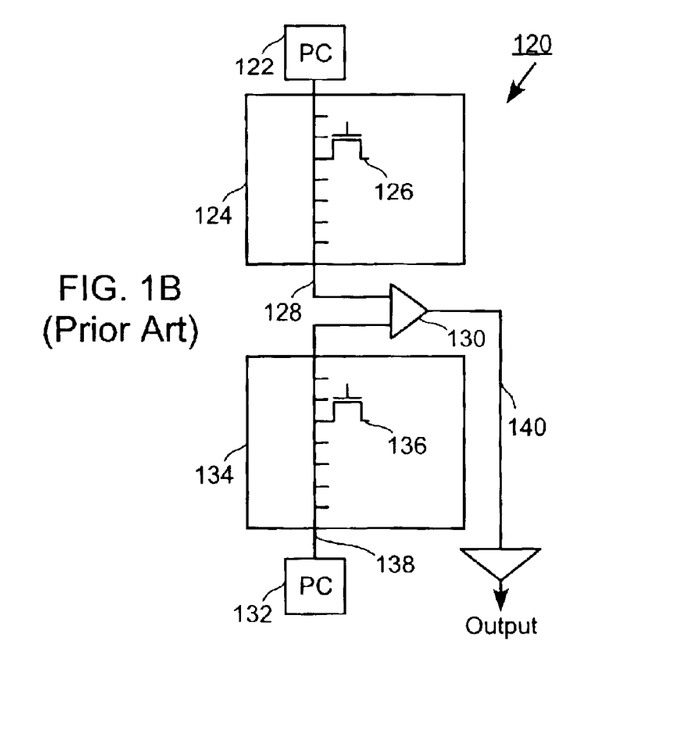

One approach to this problem is to decrease the size of the column of memory cells supported by a bitline by decreasing the number of rows in the memory array. When the number of rows of memory cells is greater than some number, the array is typically broken down into smaller arrays. As shown in FIG. 1B, a precharge circuit 122 is coupled to a top array 124 and a bottom array 134, each having half the memory cells. For exemplary purposes, one memory cell is coupled through a load transistor 126 (which is in the top array 124). Connections to other memory cells to bitline 128 is shown by dashed lines on bitline 128. Likewise, one memory cell is coupled through a load transistor 136 (which is in the bottom array 134). The memory cells of the top array 124 and the bottom array 134 are combined using a sense amp 130, which includes an AND logic operator, and the resulting output is sent out on wire 140 to the receiving circuitry not shown. Each bitline has its own precharge circuit. Bitline 128 is connected to precharge device 122 while bitline 138 is connected to precharge device 132. Now each precharge device provides charge to half the memory cells, whereas in FIG. 1A, one precharge device was providing charge to all memory cells in the column. The precharge devices 122 and 132 of FIG. 1B can now be sized smaller. Also since each bitline (128 and 138) has fewer memory cells to support the bitline loading is lower and the risk of leakage decreases. More wire is needed for this configuration, compared to FIG. 1A, since the ouput must be brought down from the sense amp 130 to the receiving circuitry (now shown). Splitting the array of FIG. 1A into smaller arrays as seen in FIG. 1B reduces the bitline loading, the leakage, and the size of the precharge devices, but increases the complexity and can sometimes be impossible due to substantial area increases for additional circuitry.

Figure 1C:
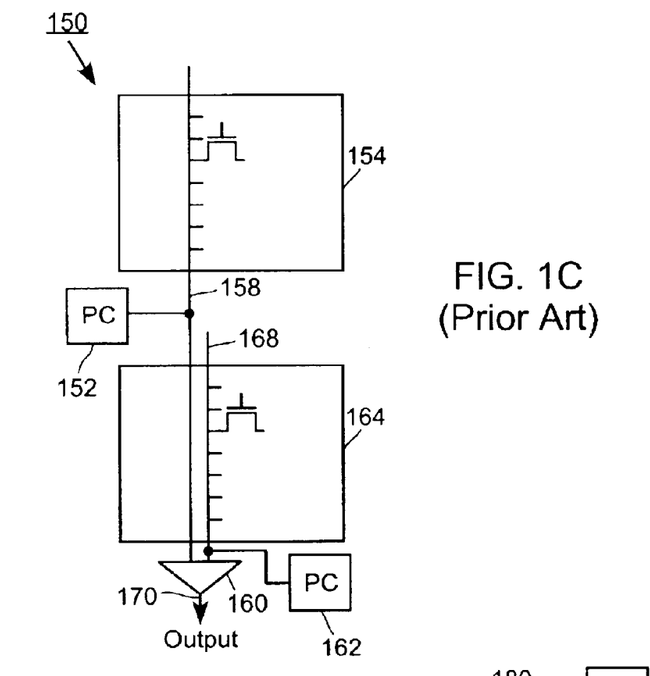

Another configuration of a precharge device 150 where memory cells are split across two arrays (banks) is shown in FIG. 1C. The top array 154 and bottom array 164 each have half the memory cells. Each bitline has its own precharge device. Bitline 158 is connected to precharge device 152 while bitline 168 is connected to precharge device 162. The memory cells of the top array 154 and the bottom array 164 are combined using a sense amp 160, which includes AND logic. As the sense amp 160 has an anding operation, the resulting output is sent out on wire 170 to the receiving circuitry not shown. To bring the output from the upper array 154 down to the sense amp 160 requires extra wire, which is traveling down and across the lower array 164 to the sense amp 160. Since it has extra wire to support, precharge device 152 must be larger than precharge device 162. Here, the precharge timing has to be tuned based on two circuits instead of one and the relative timing must be match. Matching here is very complicated to accomplish since these two precharge circuits have different lengths of wire and precharge devices of different sizes.

Since the two precharge circuits will usually not be balanced, there will be a delay mismatch in the delivery of the signal from the bitlines to the sense amp 160. With two sets of precharge circuits, the timing requirements between the precharge and other signals also becomes more complicated. Additionally since the margin (i.e., the time frame for error) is becoming tighter in newer designs, the difficulty in balancing the mismatch grows considerably.

Figure 1D:
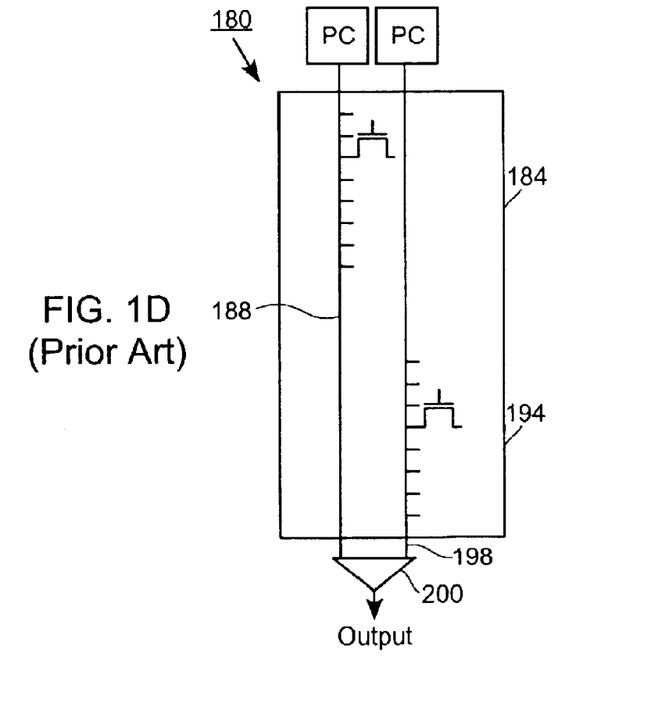
Figure 1F:
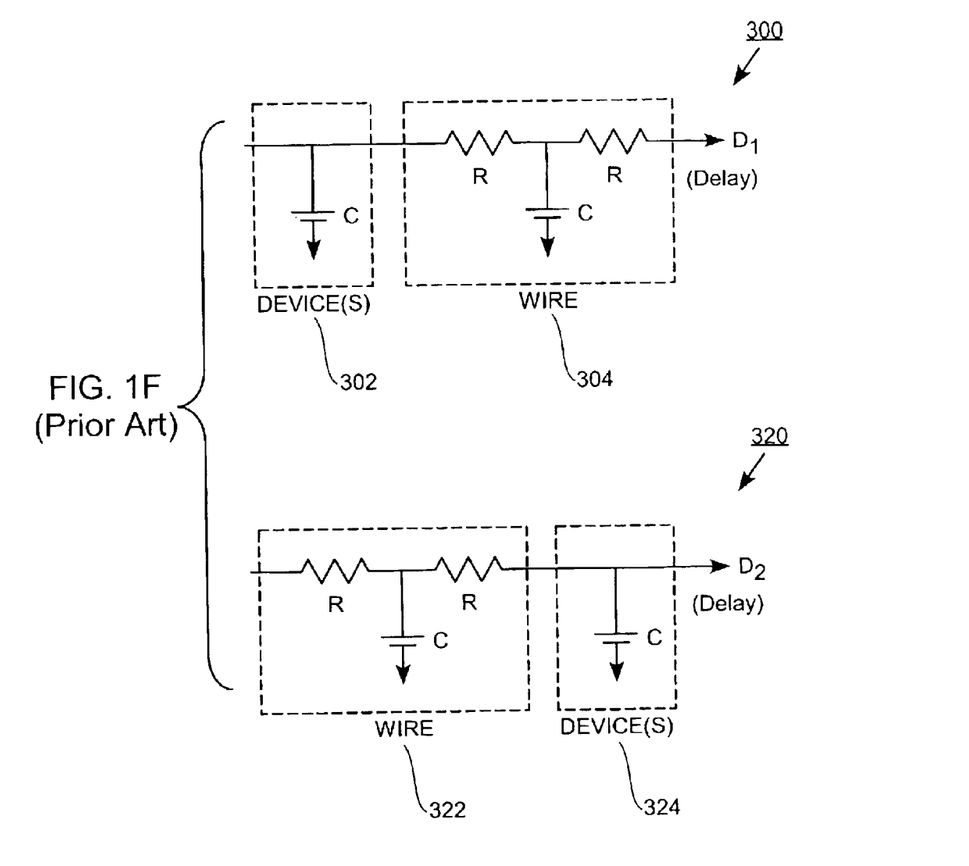
FIG. 1F is a diagram of a portion of a loaded bitline, in accordance with the prior art.

In another prior art design shown by FIG. 1D, the precharge circuit 180 again contains memory cells split across a top array 184 and a bottom array 194. The sense amp 200 is located below the bottom array 194, and the accompanying precharge devices are both located above the top array 184. In this configuration there could still be a delay mismatch because of the arrangement of the memory cells and wire is not in the same order from each precharge device. FIG. 1F schematically illustrates the effect of the arrangement of wire and devices. Schematic 300 represents bitline 188 from FIG. 1D and schematic 320 represents bitline 198 from FIG. 1D. In schematic 300, the capacitor in dashed block 302 represents the capacitive value of the devices (such as the memory cells and the precharge device) attached to bitline 188 in FIG. 1D. The resistors and capacitor in dashed block 304 represent the resistive and capacitive value of the wire of bitline 188 that extends across array 194. In schematic 320, the resistors and capacitor in dashed block 322 represent the resistive and capacitive value of the wire of bitline 198 that extends across array 184. The capacitor in dashed block 324 represents the capacitive value of the devices (such as the precharge device and the memory cells) attached to bitline 198 in FIG. 1D. As can be seen, delay one, D1 from schematic 300 will generally not equal Delay two, D2 of schematic 320. The values of D1 and D2 may be close in size, but they will not be the same. The distribution is different because the arrangement of the capacitors and the resistors will cause a difference in the size of the ultimate delay across the two bitline segments represented. Also, splitting the array to make array banks can provide the benefit of making precharge circuits smaller, but it will require more space for the additional circuitry.

In view of the foregoing, there is a need for memory designs and circuits for balancing precharge delivered to bitlines that couple to memory cells in banked architectures.

SUMMARY OF THE INVENTION

Broadly speaking, the present invention fills these needs by providing a banked memory device that provides for balanced precharging of bitlines. Further, the invention defines methods and circuit structure for achieving balanced precharge of bitlines, which reduces the precharge and read delay without splitting the memory array.

In one embodiment, a memory device design is disclosed. The memory device design includes an array having a series of storage cells, where the storage cells are arranged in rows and columns. A pair of bitline segments are provided for each column, and a first of the pair of bitline segments is coupled to an even one of the rows and a second of the pair of bitline segments is coupled to an odd one of the rows. Further provided are a pair of precharge devices. A first of the pair of precharge devices is coupled to the first of the pair of bitline segments and a second of the pair of precharge devices is coupled to the second of the pair of bitline segments.

In another embodiment, a memory device design is disclosed. The memory device design includes an array having a series of storage cells, where the storage cells are arranged in rows and columns. A pair of bitline segments are provided for each column, and a first of the pair of bitline segments is coupled to an even one of the rows and a second of the pair of bitline segments is coupled to an odd one of the rows. Further provided are a pair of precharge devices. A first of the pair of precharge devices is coupled to the first of the pair of bitline segments and a second of the pair of precharge devices is coupled to the second of the pair of bitline segments. Even numbered load devices and odd numbered load devices define an equal number of load devices that are connected to each of the first of the pair of bitlines and the second of the pair of bitlines. The equal number establishes a substantially balanced load on a bitline column that is defined by the pair of bitlines.

In yet another embodiment, a memory array design is disclosed. Memory cells are defined an intersections of rows and columns. A pair of bitline segments are defined for each column. A connecting load device of each memory cell is connected to either a first or a second of the pair of bitline segments. An equal number of load devices in each column couple to each of the pair of bitlines.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

An invention is disclosed for the design and operation of precharging bitlines of a memory device. Embodiments of the present invention provide for increased performance and balanced efficiency in bitline precharging without splitting the memory array. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Generally speaking, the invention deals with the precharging of bitlines in a memory array and the associated circuit architecture. A larger memory array is broken down into banks of memory cells. The combined banks therefore operate as a signal memory array. Although an array can be of any size, example arrays can have cell widths of 8, 16, 32, 64, etc. In one embodiment, each bitline segment will be associated with a particular bank and each bank will have its own precharge device. For example, if there are 64 columns in an array, there will be 2 bitline segments for each column, and thus 128 precharge devices. 64 precharge devices are associated with a first bank and 64 precharge devices are associated with a second bank.

As is well known, when precharging is discontinued, the bitline will remain high if a logic HIGH "1" is stored in the memory cell. In the alternative, the bitline will fall if a logic LOW "0" is stored in the memory cell.

Figure 2:
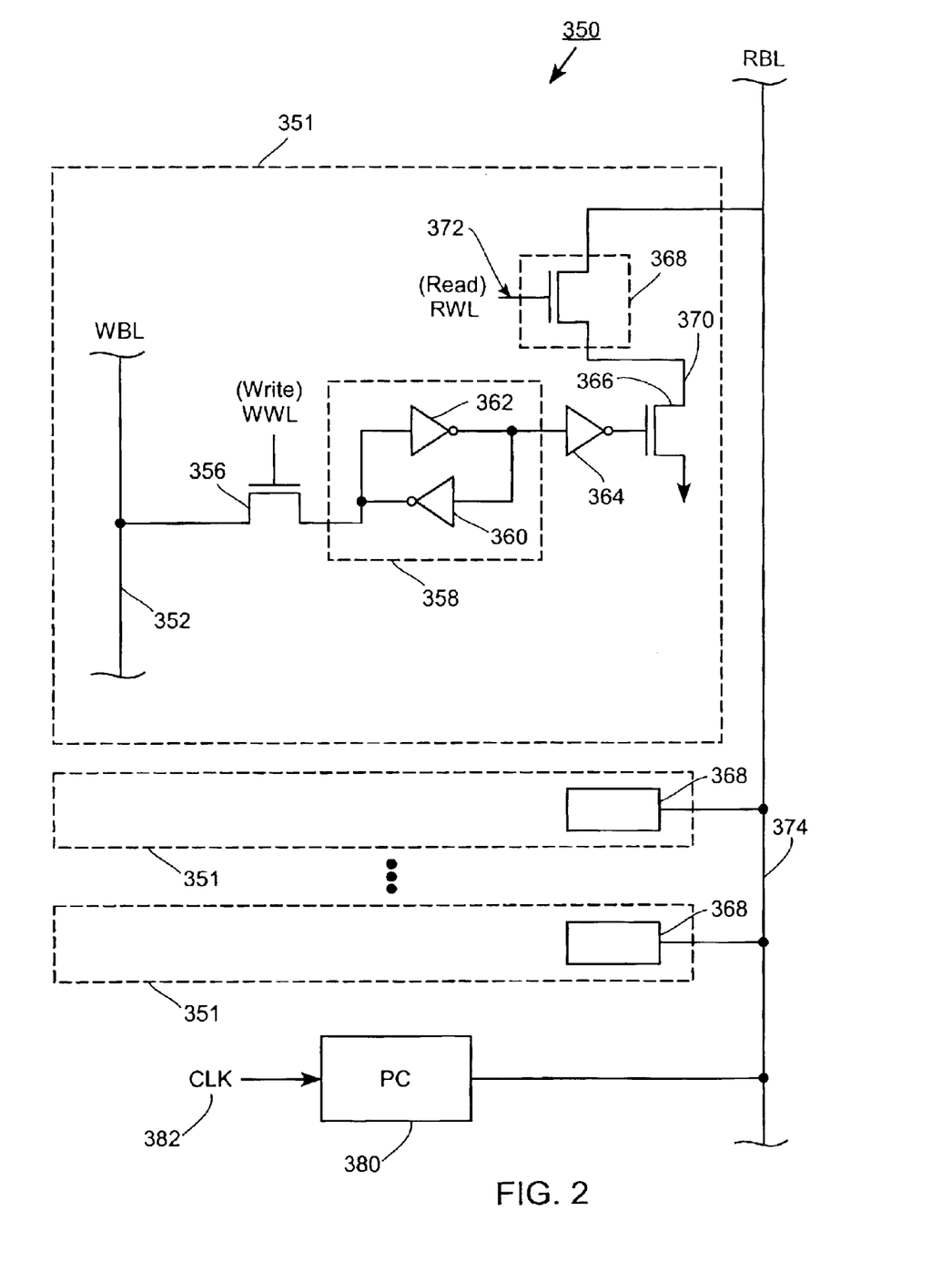
FIG. 2 is a diagram showing memory cells and associated load devices coupled to a bitline segment, in accordance with one embodiment of the present invention.

Reference is now made to FIG. 2 illustrating a block diagram of example components of a memory cell that may be connected to a bitline, in accordance with one embodiment of the present invention. The storage cell 358 shown would be compatible with a differential system. Writing is supported through a write bitline 352, and reading is supported through a read wordline 372, which couples to read bitline 374. The write bitline 352 is connected to a write wordline pass gate 356. The write wordline pass gate 356 provides access to the storage cell 358, which is shown inside a dashed line box. In this example, the storage cell 358, acts like a latch and is made up of inverter 362 and inverter 360. Of course, other storage circuits are equally applicable here.

Continuing with the description of FIG. 2, the operation of reading data from the storage cell 358 begins when precharge is applied by the read bitline 374. The read bitline 374 receives a voltage from the precharge device 380 when the clock 382 sends a signal to begin precharging. When the read bitline 374 delivers the voltage, the RWL device 368, which acts as a load device, is turned on with a rising edge. Since the RWL 368 is an N-type device, it will be turned ON when its gate 374 receives a logic high. If the storage cell 358 is storing a logic 0, the invertor 364 will apply a logic 1 to gate 366. Gate 366 being open, the ground potential will be directly coupled to the read bitline 374 through RWL 368. This will pull the read bitline 374 down, thus enabling the reading of the logic 0, which was stored in the storage cell 358.

Figure 3:
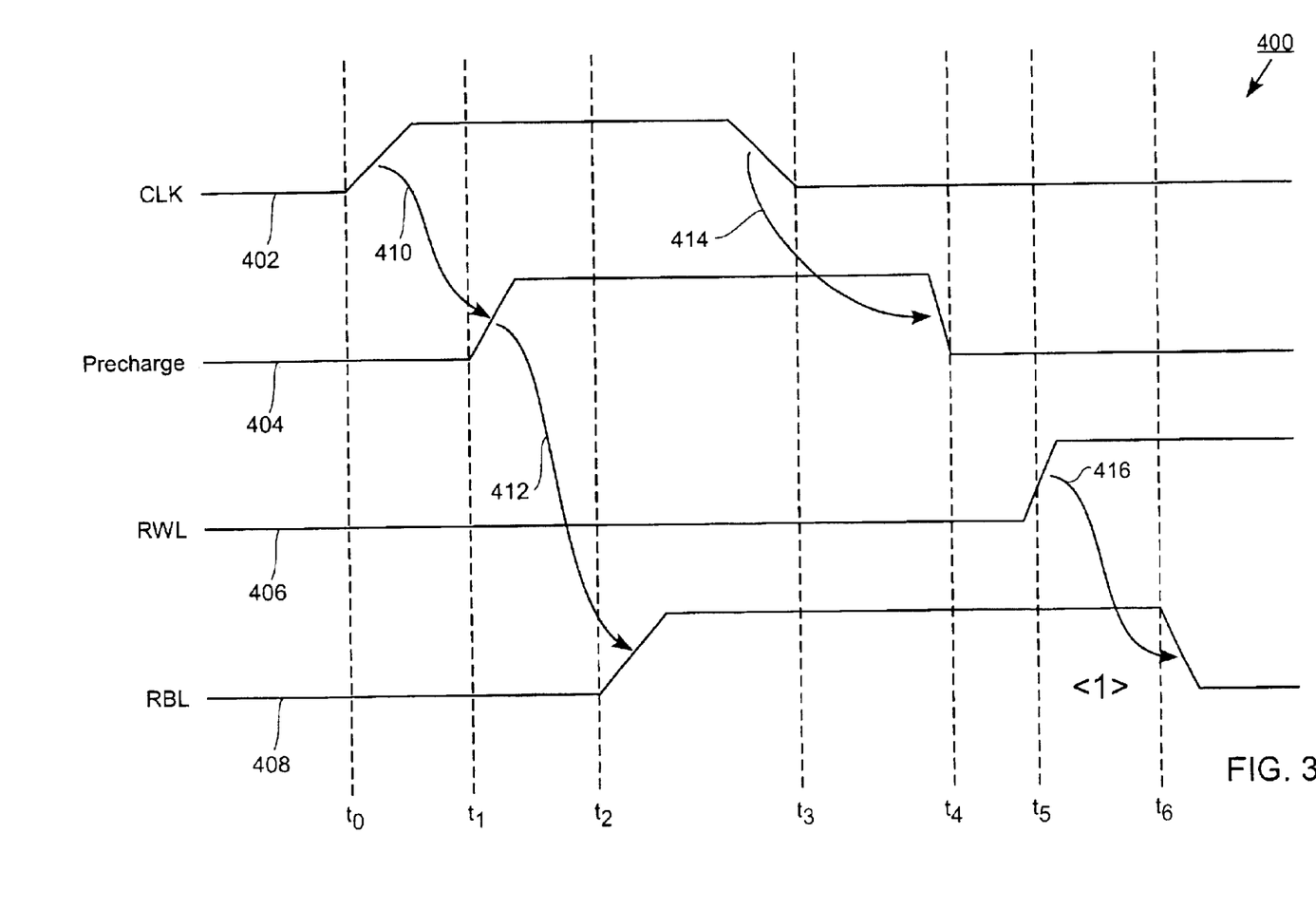
FIG. 3 is a diagram showing a time chart associated with a precharge operation, in accordance with one embodiment of the present invention.

Conversely, if the storage cell 358 is storing a logic 1, the invertor 364 will apply a logic 0 to the gate 366. Gate 366 being closed, the precharged potential on the read bitline 374 will be maintained, as the RWL 368 is open. When the particular storage cell of circuit 351 is not active, the load device of 368 will still be coupled to the read bitline 374. FIG. 3 shows a diagram of a series of related time charts associated with a precharge circuit, in accordance with one embodiment of the present invention. The time charts follow the timing of activity of a series of variables. The timing of a clock is shown in chart 402. The timing of a precharge device is shown in chart 404. The timing of a RWL (read word line) is shown in chart 406 (see FIG. 2 above where RWL is defined as read word line that is coupled to a pass gate 368. Finally the timing of the read bitline is shown in chart 408. At time $t_0$ the clock is activated high. Once the clock 402 rises the precharge 404 is caused to rise at $t_1$, as shown by 410. In this example, the precharge is an active high precharge, as seen here, but it can also be an active low precharge. Moving forward in time, once the precharge 404 rises, the precharge causes the read bitline to begin rising at $t_2$. As shown, the precharge's rising edge is followed by the read bitline's rising edge as shown with arrow 412.

As time passes the next transition will take place in the clock. The clock will independently go low and the falling edge of the clock at $t_3$ will cause the precharge to go low, basically causing the precharge device to turn off. Now as time passes the clock's rising edge begins to fall, and at $t_3$ the clock returns to its initial level before a next clock cycle. The clock's falling edge is followed by the precharge's falling edge as shown by arrow 414. The RWL 404 will go high at $t_5$, because the precharge should have brought the read bitline up to a precharged state. The precharge device will be off before the RWL transitions high. As the RWL rises data is read from the storage cell.

The transition of RWL going high causes RWL to read the contents of the storage cell. When RWL goes high that turns ON the read word line pass gate 368, as seen on FIG. 2. When precharge is no longer applied, read bitline will either go to logic 0 or stay up at the precharged logic 1 (correlating with the value contained in the storage cell being read). In this example, the storage cell contained a logic 0, and therefore, the RBL contained a logic 1, as read between t5 and t6. At t6, the RBL will fall to logic 0 as shown by 416, since it is no longer being precharged.

Therefore, the clock triggers the precharge, then the precharge triggers the read bitline, and independently clock triggers the RWL. The timing synchronization (clock to precharge, clock to RWL, precharge to read bitline, etc.) is crucial for reading the data from storage cells. Since timing synchronization is key to proper reading of data, significant load mismatches can hurt the performance of a memory device.

Figure 4A:
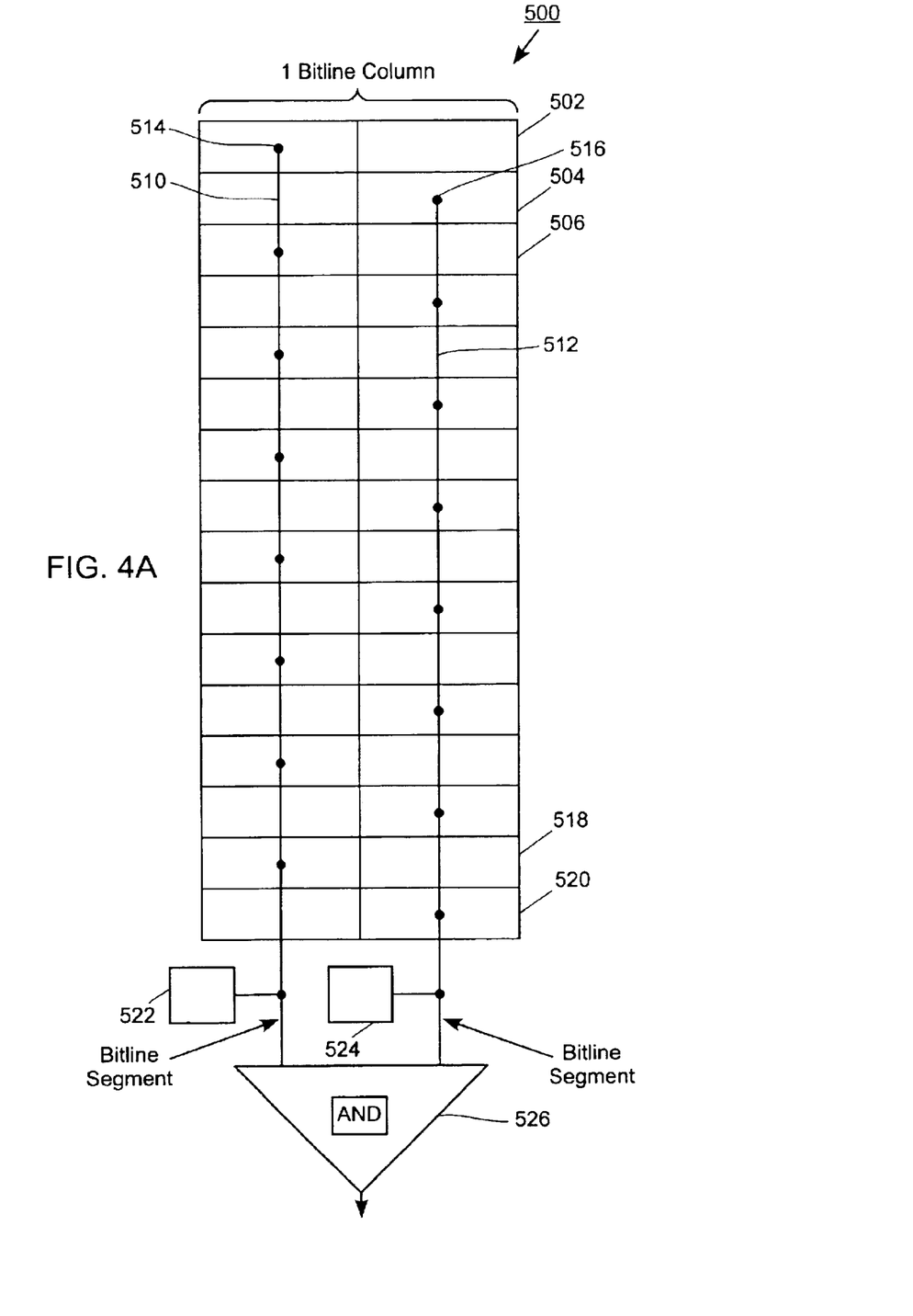
FIGS. 4A and 4B are diagrams showing a block diagram of the even/odd connection across bitline pairs for a column, in accordance with one embodiment of the present invention.

FIG. 4A is a diagram showing the distribution of two precharge circuits that couple to two banks of a memory device, in accordance with one embodiment of the present invention. Alternate sets of storage cell rows are grouped together down the column of a pair of bitline segments. The load from each of the even rows is tied to one bitline segment, and the load from each of the odd rows is tied to another bitline segment. For example, bitline segment 510 is attached to row 502, and row 506, and so on up to row 518. The connection 514 between the bitline 510 and the first row 502 is shown where the bitline and row intersect. While bitline 512 is attached to row 504, and so on up to row 520. The connection 516 between the bitline 512 and the second row 504 is shown where the bitline and row intersect. The precharge devices can be designed at either the top or the bottom of the array.

In FIG. 4A, both precharge devices are located at the bottom of the array. Bitline 510 is attached to precharge device 522 and bitline 512 is attached to precharge device 524. Bitlines 510 and bitline 512 are combined using a sense amp 526 that includes an AND operator, and is located below the precharge devices. With this arrangement, the number of cells attached to the two bitlines is the same, but the vertical distribution is off by no more than the height of one cell (i.e., the difference in additional wire length). This arrangement will allow for a substantially even distribution of the loads between the two bitline segments (i.e., two banks) to each of the two precharge devices. The load mismatch of the bitlines, which is only off by one row wire length is not significant, as a typical height between cells is only approximately 5 microns.

Figure 4B:
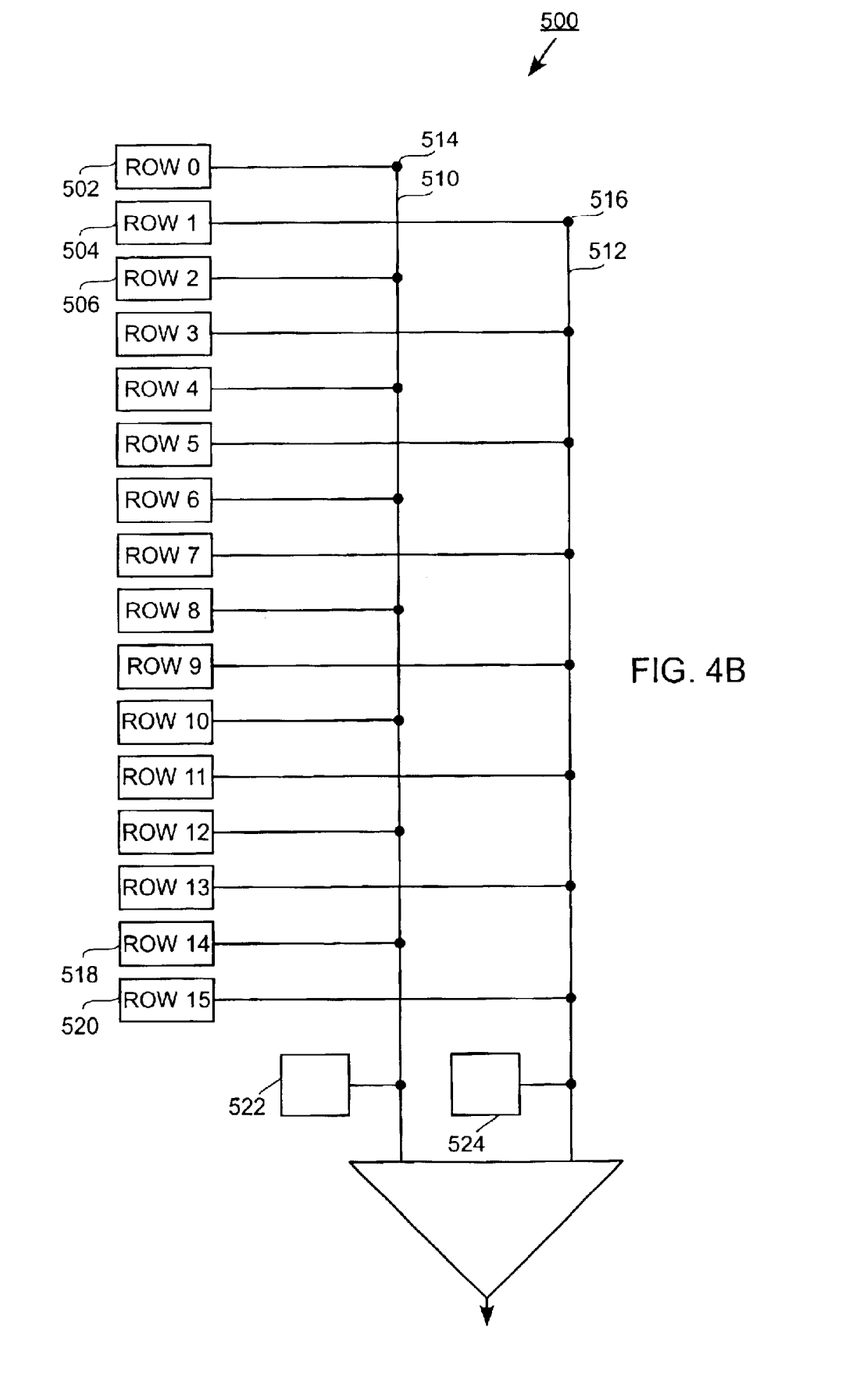

FIG. 4B is a schematic showing a front view of the precharge circuit arrangement of FIG. 4A, in accordance with one embodiment of the present invention. In the precharge circuit arrangement 500, the load of the even rows of the storage cells are tied to one bitline segment 510, and the load of the odd rows are tied to a second bitline segment 512. For example, bitline segment 510 is attached to the following rows; row 0 502, row 2 506, row 4, row 6, row 8, row 10, row 12, down to row 14 518. The connection 514 between bitline 510 and row 0 502 is shown where the bitline and row intersect. Bitline segment 512 is attached to row 1 504, row 3, row 5, row 7, row 9, row 11, row 13, and finally row 15 520. The connection 516 between bitline 512 and row 1 504 is shown where the bitline and row intersect. Both precharge devices are located at the bottom of the array, although they may be connected at the top. Bitline segment 510 is attached to precharge device 522 and bitline segment 512 is attached to precharge device 524. Bitline segments 510 and 512 are combined using a sense amp 526, which includes AND logic. As discussed above, with this arrangement the number of cells attached to the two bitlines is the same, but the physical distribution along the vertical axis is only off by the height of one cell.

This arrangement will allow for an even distribution of the loads between the two bitline segments to the prechargers. The delay incurred by the extra height of the cell has a very small value, a fraction of a picosecond up to a picosecond, which would be an insignificant mismatch between delays. Margins are typically measured by percentages. With respect to post level margins, when two margins are self-timed, if both start from the same clock as the precharge, the delay caused by being off by the height of one cell is very small and can be considered insignificant. In one embodiment, the load mismatch in FIGS. 4A and 4B could be balanced by extending the wire so that both wires are of the same length.

Figure 5:
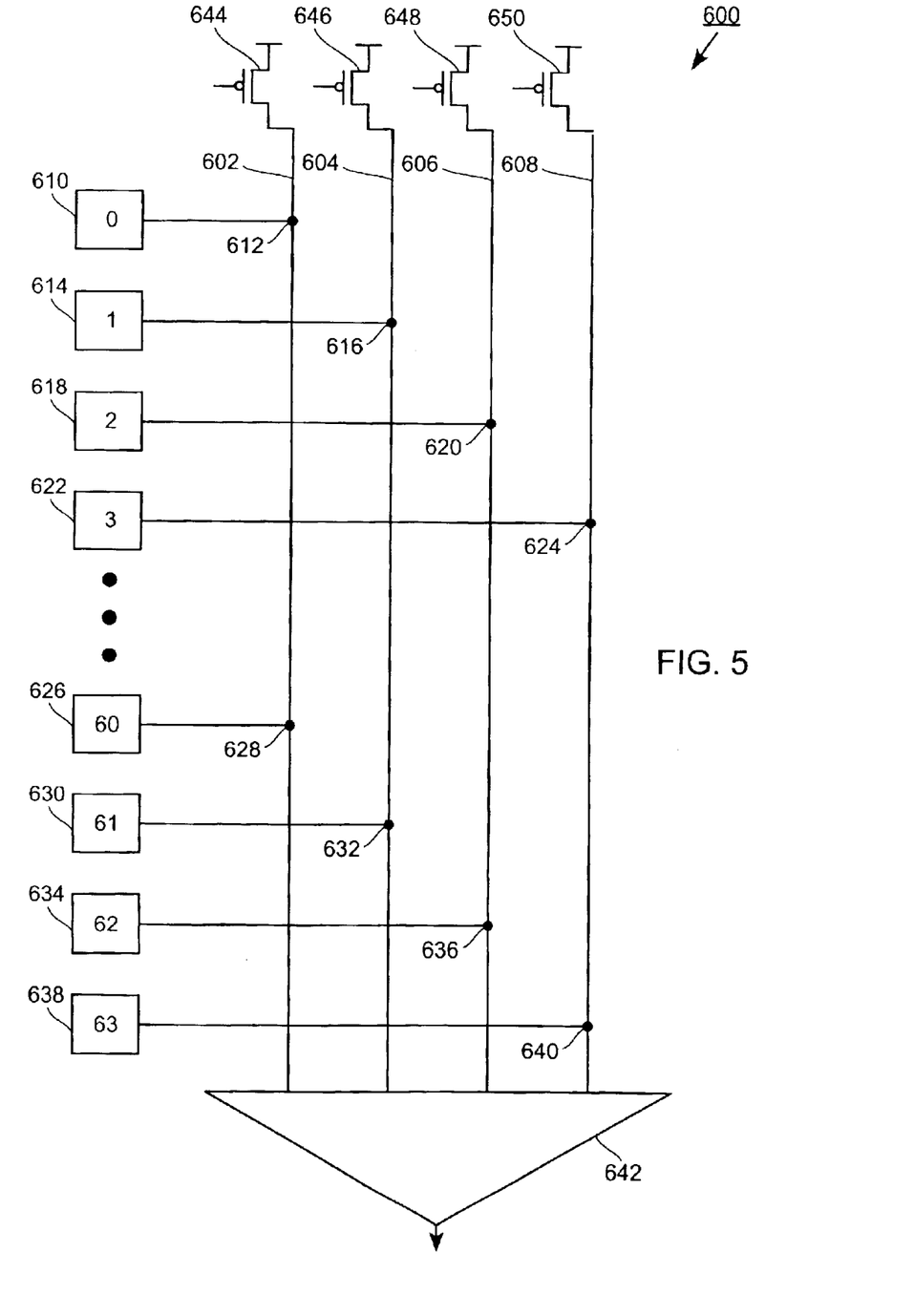
FIG. 5 is a diagram showing bitline segments and the load distribution for each precharge device, in accordance with one embodiment of the present invention.

FIG. 5 is a diagram showing a precharge circuit 600, in accordance with one embodiment of the present invention, using 4 sets of bitlines to cut down load and delay even further. As can be appreciated, more or less sets of bitlines can be used depending on the design. Sets of storage cell rows are grouped together down the column of a bitline. The load from each of the rows is tied to one of four bitline segments. The first bitline segment 602 is connected to row 0 610 at connection point 612. The last row connected to bitline 602 is row 60 626 connected at connection point 628. Bitline 604 is connected to row 1 614 at connection point 616. The last row connected to bitline 604 is row 61 630 connected at connection point 632. The third bitline, bitline 606 is connected to row 2 618 at connection point 620. The last row connected to bitline 606 is row 62 634 connected at connection point 636.

The fourth bitline in FIG. 5, bitline 608 is connected to row 3 622 at connection point 624. The last row connected to bitline 608 is row 63 638 connected at connection point 640. The precharge devices of precharge circuit 600 are all located at the top of the precharge circuit 600. Bitline segment 602 is attached to precharge device 644, bitline segment 604 is attached to precharge device 646, bitline segment 606 is attached to precharge device 648, and bitline segment 608 is attached to precharge device 650. Bitlines 602, 604, 606, and 608 are combined using a sense amp 642, which includes appropriate AND logic. With this arrangement the number of cells attached to the four bitline segments is the same, but the vertical distribution is off by the height of up to three cells. This arrangement will allow for an even distribution of the loads between the four bitline segments to the prechargers. The load mismatch of the bitlines is off by at the most three rows, which is not significant as a typical height of a cell is about 5 microns.

As discussed above in connection with FIG. 5, with four bitlines the load mismatch could be off by a maximum of up to three times the height of one cell. When the arrays are split N times the height mismatch will be N-1. In other words, at the point where the device loads are combined, such as for example at the sense amp, the height mismatch across the bitlines would be off by the height of N-1 cells, at the most. Adjustments to the wire length can be made to remove this offset, since the number of load transistors connected to each bitline segment remains exactly the same.

Figure 6:
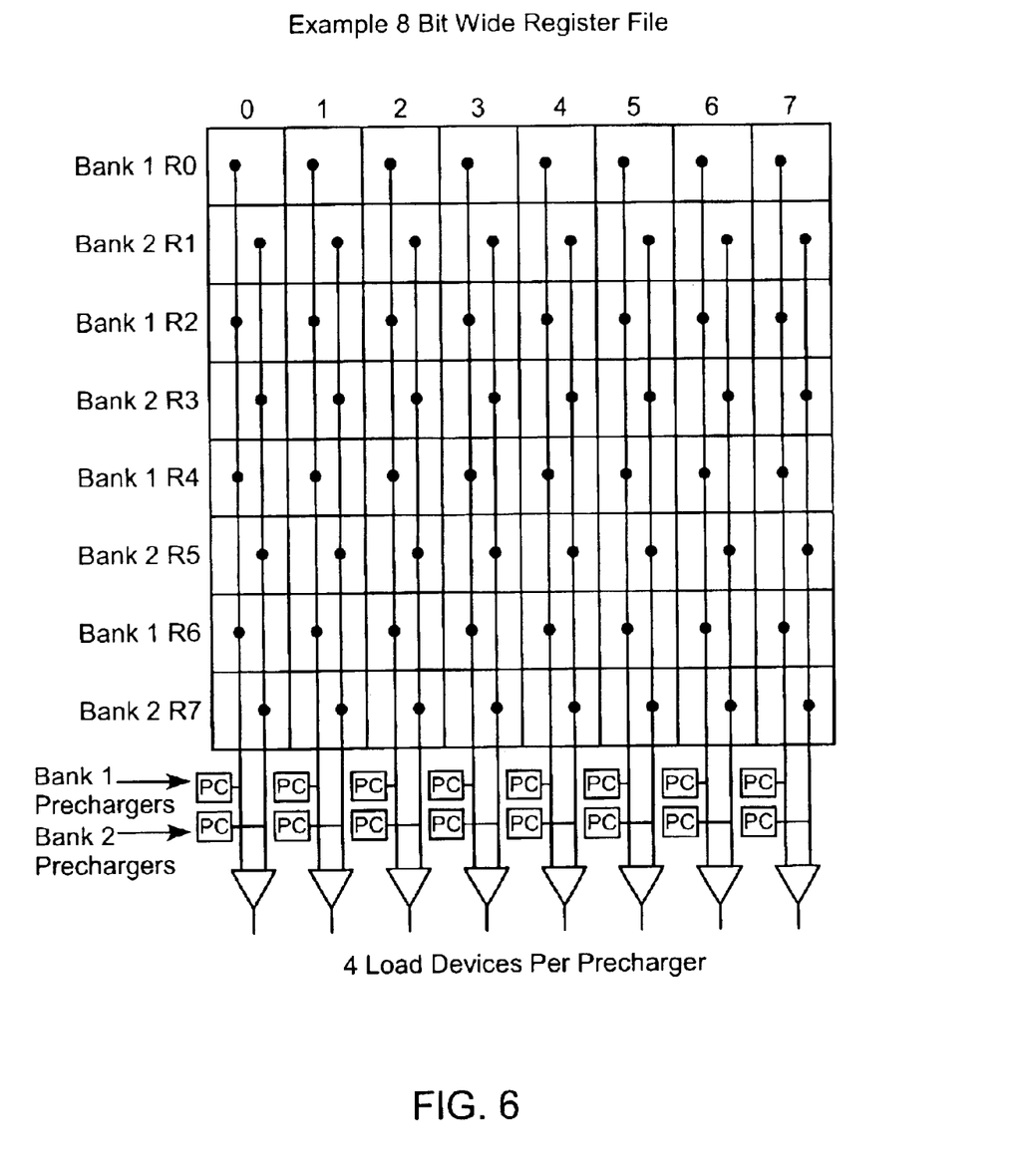
FIG. 6 is a block diagram of a memory array with equal load distribution across the bitline segments of each memory column, in accordance with one embodiment of the present invention.

FIG. 6 illustrates an exemplary memory array, which can be used as an 8 bit wide register file. Although an 8 bit wide register file is shown, the register file can be of any width, such as 16 bits, 32 bits, 64 bits, etc., depending on the implementation. In this example, it is shown that each bitline is actually composed of two bitline segments. Each bitline segment defines one of two banks (Bank 1 and Bank 2), and each bitline segment is coupled to either Bank 1 prechargers or Bank 2 prechargers. The precharge load of each load device (i.e., of a memory cell), per column, is therefore evenly split among the two bitline segments. In this example, each bitline segment and precharger is coupled to four cells (i.e., load devices).

In FIGS. 4A and 4B 16 rows are shown alternately distributed across two bitline segments. In another embodiment 32 rows are alternatively distributed across two bitline segments. In FIG. 5, 64 rows are alternatively distributed across four bitline segments. In yet another embodiment, an array of 128 cells could be distributed across a series of two or more even bitline segments with appropriate modifications to ensure that area requirements are maintained. Other combinations of rows and bitlines are also possible using the alternating configurations disclosed above.

In one embodiment, the bitlines could be stacked up over each other, this would require additional wire tracks.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory device, comprising:
    an array having a series of storage cells, the storage cells being arranged in rows and columns;
    a pair of bitline segments defined for each column, wherein a first of the pair of bitline segments is coupled to an even one of the rows and a second of the pair of bitline segments is coupled to an odd one of the rows; and
    a pair of precharge devices, a first of the pair of precharge devices being coupled to the first of the pair of bitline segments and a second of the pair of precharge devices being coupled to the second of the pair of bitline segments, each of the pair of precharge devices being separately coupled to its respective bitline segment and without coupling the pair of precharge devices.

2. A memory device as recited in claim 1, further comprising:
    even numbered storage devices of even rows being coupled to the first of the pair of bitlines; and
    odd numbered storage devices of odd rows being coupled to the second of the pair of bitlines.

3. A memory device as recited in claim 2, further comprising:
    even numbered load devices interconnecting the even numbered storage devices to the first of the pair of bitlines; and
    odd numbered load devices interconnecting the odd numbered storage devices to the second of the pair of bitlines.

4. A memory device as recited in claim 3, wherein the even numbered load devices and the odd numbered load devices define an equal number of load devices connected to each of the first of the pair of bitlines and the second of the pair of bitlines, the equal number establishing a balanced load on the pair of bitlines.

5. A memory device as recited in claim 1, wherein each of the bitline segments has about an equal length and carries an equal number of load devices to produce a substantially balanced precharge delay of each column of the memory device.

6. A memory device as recited in claim 1, further comprising: logic for combining a signal output of the bitline segments.

7. A memory device as recited in claim 6, further comprising:
    an amplifier for amplifying an output generated by the logic for combining the signal output of the bitline segments.

8. A memory device as recited in claim 6, wherein the logic for combining the signal output of the bitline segments includes AND logic circuitry.

9. A memory device, comprising:
    an array having a series of storage cells, the storage cells being arranged in rows and columns;
    a pair of bitline segments defined for each column, wherein a first of the pair of bitline segments is coupled to an even one of the rows and a second of the pair of bitline segments is coupled to an odd one of the rows; and a pair of precharge devices, a first of the pair of precharge devices being coupled to the first of the pair of bitline segments and a second of the pair of precharge devices being coupled to the second of the pair of bitline segments, wherein the pair of precharge devices are not coupled to each other;

wherein even numbered load devices and odd numbered load devices define an equal number of load devices connected to each of the first of the pair of bitlines and the second of the pair of bitlines, the equal number establishing a substantially balanced load on a bitline column that is defined by the pair of bitlines.

10. A memory device as recited in claim 9, wherein each of the bitline segments has about an equal length and carries an equal number of load devices to produce a substantially balanced precharge delay of each column of the memory device.

11. A memory device as recited in claim 9, further comprising: logic for combining a signal output of the bitline segments.

12. A memory device as recited in claim 11, further comprising:

an amplifier for amplifying an output generated by the logic for combining the signal output of the bitline segments.

13. A memory device as recited in claim 11, wherein the logic for combining the signal output of the bitline segments includes AND logic circuitry.

14. A memory array, comprising:

memory cells defined an intersections of rows and columns;

a pair of bitline segments defined for each column; and a connecting load device of each memory cell being connected to either a first or a second of the pair of bitline segments, wherein an equal number of load devices in each column couple to each of the pair of bitlines; and a pair of precharge devices, each of the pair of precharge devices being coupled to the pair of bitlines in each column, wherein the pair of precharge devices are not coupled together.

15. A memory array as recited in claim 14, wherein the memory array is a banked memory array.

16. A memory array as recited in claim 14, further comprising:

combining logic for combining an output of each of the pair of bitlines.

17. A memory array as recited in claim 16, an amplifier for receiving an output of the combining logic of each column.

18. A memory array as recited in claim 16, wherein the combining logic includes AND logic.

19. A memory array as recited in claim 17, wherein the amplifier is an operational amplifier.

* * * * *